(12) United States Patent
Kim

(10) Patent No.: US 8,987,775 B2
(45) Date of Patent: Mar. 24, 2015

(54) LIGHT EMITTING DEVICE PACKAGE

(71) Applicant: Ki Bum Kim, Osan-si (KR)

(72) Inventor: Ki Bum Kim, Osan-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/078,369

(22) Filed: Nov. 12, 2013

(65) Prior Publication Data

US 2014/0084330 A1    Mar. 27, 2014

Related U.S. Application Data

(63) Continuation of application No. 12/720,235, filed on Mar. 9, 2010, now Pat. No. 8,610,156.

(30) Foreign Application Priority Data

Mar. 10, 2009  (KR) .................. 10-2009-0020064
Mar. 5, 2010   (KR) .................. 10-2010-0020041
Mar. 5, 2010   (KR) .................. 10-2010-0020043

(51) Int. Cl.
    *H01L 33/62* (2010.01)
    *H01L 33/48* (2010.01)

(52) U.S. Cl.
    CPC .............. *H01L 33/62* (2013.01); *H01L 33/483* (2013.01); *H01L 33/486* (2013.01); *H01L 2224/48091* (2013.01); *H01L 2224/48247* (2013.01)
    USPC .............. 257/99; 257/E33.057; 257/E33.058; 257/E33.066

(58) Field of Classification Search
    None
    See application file for complete search history.

(56) References Cited

U.S. PATENT DOCUMENTS

| | | | |
|---|---|---|---|
| 3,942,245 A | 3/1976 | Jackson et al. | 29/827 |
| 5,859,471 A | 1/1999 | Kuraishi et al. | 257/666 |
| 6,087,715 A | 7/2000 | Sawada et al. | 257/666 |
| 6,610,563 B1 | 8/2003 | Waitl et al. | 438/166 |
| 6,624,491 B2 | 9/2003 | Waitl et al. | 257/434 |
| 6,759,733 B2 | 7/2004 | Arndt | 257/672 |
| 6,774,401 B2 | 8/2004 | Nakada et al. | 257/82 |
| 6,812,503 B2 | 11/2004 | Lin et al. | 257/99 |
| 6,822,265 B2 | 11/2004 | Fukasawa et al. | 257/81 |
| 6,847,116 B2 | 1/2005 | Isokawa | 257/736 |
| 6,936,855 B1 | 8/2005 | Harrah | 257/88 |

(Continued)

FOREIGN PATENT DOCUMENTS

| | | |
|---|---|---|
| DE | 20 2007 012 162 | 3/2008 |
| EP | 1 998 380 | 12/2008 |

(Continued)

OTHER PUBLICATIONS

U.S. Office Action issued in related U.S. Appl. No. 12/702,395 dated Nov. 14, 2011.

(Continued)

*Primary Examiner* — Joseph Schoenholtz
(74) *Attorney, Agent, or Firm* — KED & Associates LLP

(57) ABSTRACT

Embodiments include a light emitting device package. The light emitting device package comprises a housing including a cavity; a light emitting device positioned in the cavity; a lead frame including a first section electrically connected to the light emitting device in the cavity, a second section, which penetrates the housing, extending from the first section and a third section, which is exposed to outside air, extending from the second section; and a metal layer positioned on an area defined by a distance which is distant from the housing in the second section of the lead frame.

20 Claims, 7 Drawing Sheets

(56) References Cited

U.S. PATENT DOCUMENTS

| | | | |
|---|---|---|---|
| 7,258,816 B2 | 8/2007 | Tamaki et al. | 252/301.4 |
| 7,282,785 B2 | 10/2007 | Yoshida | 257/666 |
| 7,514,293 B2 | 4/2009 | Amano et al. | 438/112 |
| 7,554,129 B2 | 6/2009 | Roth et al. | 257/103 |
| 7,705,366 B2 | 4/2010 | Seo et al. | 257/99 |
| 7,709,952 B2 | 5/2010 | Park et al. | 257/717 |
| 7,737,546 B2 | 6/2010 | Moy et al. | 257/696 |
| 7,795,626 B2 | 9/2010 | Chen et al. | 257/88 |
| 7,812,360 B2 | 10/2010 | Yano | 257/98 |
| 7,815,343 B2 | 10/2010 | Nii et al. | 362/311.03 |
| 7,928,457 B2 | 4/2011 | Kato et al. | 257/98 |
| 2002/0075634 A1 | 6/2002 | Uenishi et al. | 361/523 |
| 2004/0108595 A1 | 6/2004 | Shen | 257/737 |
| 2005/0224918 A1 | 10/2005 | Kobayashi et al. | 257/600 |
| 2005/0258524 A1 | 11/2005 | Miyaki et al. | 257/676 |
| 2007/0096133 A1 | 5/2007 | Lee et al. | 257/99 |
| 2007/0176194 A1 | 8/2007 | Wakamatsu et al. | 257/98 |
| 2007/0246731 A1 | 10/2007 | Isokawa et al. | 257/99 |
| 2007/0262328 A1 | 11/2007 | Bando | 257/79 |
| 2007/0295969 A1 | 12/2007 | Chew et al. | 257/79 |
| 2008/0089011 A1 | 4/2008 | Tasci et al. | 361/502 |
| 2008/0210965 A1 | 9/2008 | Hung | 257/98 |
| 2008/0293190 A1 | 11/2008 | Inao et al. | 438/123 |
| 2008/0296592 A1 | 12/2008 | Osamu | 257/89 |
| 2008/0303157 A1 | 12/2008 | Cheng et al. | 257/758 |
| 2009/0026480 A1* | 1/2009 | Hayashi et al. | 257/98 |
| 2009/0057850 A1* | 3/2009 | Moy et al. | 257/666 |
| 2009/0096041 A1 | 4/2009 | Sakakibara et al. | 257/419 |
| 2009/0176335 A1 | 7/2009 | Amano et al. | 438/123 |
| 2009/0289274 A1 | 11/2009 | Park | 257/99 |
| 2010/0163918 A1 | 7/2010 | Kim et al. | 257/99 |
| 2010/0289051 A1 | 11/2010 | Lee et al. | 257/98 |
| 2012/0032197 A1* | 2/2012 | Kurimoto | 257/88 |

FOREIGN PATENT DOCUMENTS

| | | |
|---|---|---|
| JP | 63-102247 | 5/1988 |
| JP | 01-305551 | 12/1989 |
| JP | 08-330497 | 12/1996 |
| JP | 2004-172160 | 6/2004 |
| JP | 2004-311857 A | 11/2004 |
| KR | 10-2002-0079449 | 10/2002 |
| KR | 10-2005-0003226 | 1/2005 |
| KR | 10-2006-0030356 | 4/2006 |
| KR | 10-2007-0006747 | 1/2007 |
| KR | 10-2008-0017522 | 2/2008 |
| WO | WO 2007/108667 | 9/2007 |
| WO | WO 2008/038997 | 4/2008 |

OTHER PUBLICATIONS

U.S. Office Action issued in co-pending U.S. Appl. No. 12/720,235 dated Nov. 28, 2011.
U.S. Office Action issued in co-pending U.S. Appl. No. 12/720,235 dated Mar. 28, 2012.
U.S. Notice of Allowance issued in related U.S. Appl. No. 12/702,395 dated May 2, 2012.
U.S. Office Action issued in co-pending U.S. Appl. No. 12/720,235 dated Nov. 14, 2012.
U.S. Office Action issued in co-pending U.S. Appl. No. 12/720,235 dated Apr. 3, 2013.
U.S. Notice of Allowance issued in co-pending U.S. Appl. No. 12/720,235 dated Aug. 12, 2013.
European Search Report issued in related Application No. 10 15 5808 dated Oct. 6, 2010.
European Search Report issued in related Application No. 10 15 6030 dated Oct. 6, 2010.
European Search Report issued in related Application No. 10 15 6030 dated Apr. 21, 2011.
Korean Office Action issued in related Application No. 10-2009-0020064 dated Nov. 11, 2010.
Tin Plating [on line], [retrieved Mar. 15, 2012]. Retrieved from the internet <URL: http://en.wikipedia.org/wiki/Plating#Tin_plating>.
He Shu-guang; Li Li; Qi Er-shi;, "Study on the Quality Improvement of Injection Molding in LED Packaging Processes Based on DOE and Data Mining," Wireless Communications, Networking and Mobile Computing, 2007. WiCom 2007. International doi: 10.1109/WICOM2007.1626.
Lin, Tony, and Belli Chananda. "Quality Improvement of an Injection Molded Product Using Design of Experiments: A Case Study." Quality Engineering 16.1 (2003): 99-104.
Diodes Incorporated, "Recommended Soldering Techniques"; www.diodes.com; pp. 1-7.
"Matte Tin Plating for Pb-Free Devices Backward Compatibility for Tin-Lead Solders," on Semiconductor Publication TND312D, Aug. 2005.
Japanese Office Action dated Dec. 17, 2013.

* cited by examiner

LIGHT EMITTING DEVICE PACKAGE

CROSS-REFERENCE TO RELATED APPLICATION

This application is a Continuation of co-pending U.S. patent application Ser. No. 12/720,235 filed on Mar. 9, 2010, which claims priority under 35. U.S.C §119(e) to Korean Patent Application No. 10-2009-0020064, filed in the Republic of Korea on Mar. 10, 2009, Korean Patent Application No. 10-2010-0020041, filed in the Republic of Korea on Mar. 5, 2010, Korean Patent Application No. 10-2010-0020043, filed in the Republic of Korea on Mar. 5, 2010, the entire contents of which are hereby incorporated herein by reference.

BACKGROUND

Field

The present application relates to a light emitting device package and a manufacture method thereof.

Group III-V nitride semiconductor is in the limelight as a main material of a light emitting device such as a light emitting diode or a laser diode because of its physical and chemical characteristics. The group III-V nitride semiconductor normally has a semiconductor material having a following combination equation.

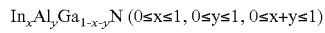

$In_xAl_yGa_{1-x-y}N$ ($0 \le x \le 1$, $0 \le y \le 1$, $0 \le x+y \le 1$)

The light emitting diode changes electricity to light or infrared light by using its characteristics as a combination semiconductor so that it transmits signal, and the light emitting diode is used as a light source, which is a kind of semiconductor device.

The light emitting diode or the laser diode using nitride semiconductor material like this is widely used in a light emitting device, and used as a light source of various products such as a light emitting unit of key pad of a mobile phone, an electric sign and lighting, etc.

SUMMARY

One embodiment of the present invention provides a light emitting device package comprising: a housing including a cavity; a light emitting device positioned in the cavity; a lead frame including a first section electrically connected to the light emitting device in the cavity, a second section, which penetrates the housing, extending from the first section and a third section, which is exposed to outside air, extending from the second section; and a metal layer positioned on an area defined by a distance which is distant from the housing in the second section of the lead frame.

Another embodiment of the present invention provides a light emitting device package comprising: a housing including a cavity; a light emitting device positioned in the cavity; a lead frame including a first section electrically connected to the light emitting device in the cavity, a second section, which penetrates the housing, extending from the first section and a third section, which is exposed to outside air, extending from the second section; and a metal layer positioned in an area defined by a distance which is distant from the housing in the second section of the lead frame to prevent moisture from entering the area.

In addition, another embodiment of the present invention provides a light emitting device package comprising: a housing including a cavity; a light emitting device positioned in the cavity; a lead frame including a first section electrically connected to the light emitting device in the cavity, a second section, which penetrates the housing, extending from the first section and a third section, which is exposed to outside air, extending from the second section; and an sealant for blocking an area from outside air, which is defined by a distance from the housing in the second section of the lead frame.

BRIEF DESCRIPTION OF THE DRAWINGS

The above and other features and advantages of the present invention will become more apparent to those of ordinary skill in the art by describing in detail preferred embodiments thereof with reference to the attached drawings, in which.

DETAILED DESCRIPTION OF THE PREFERRED EMBODIMENTS

Above all, a theoretical background relating to the present invention is described in detail with respect to appended drawings.

Figure 1:
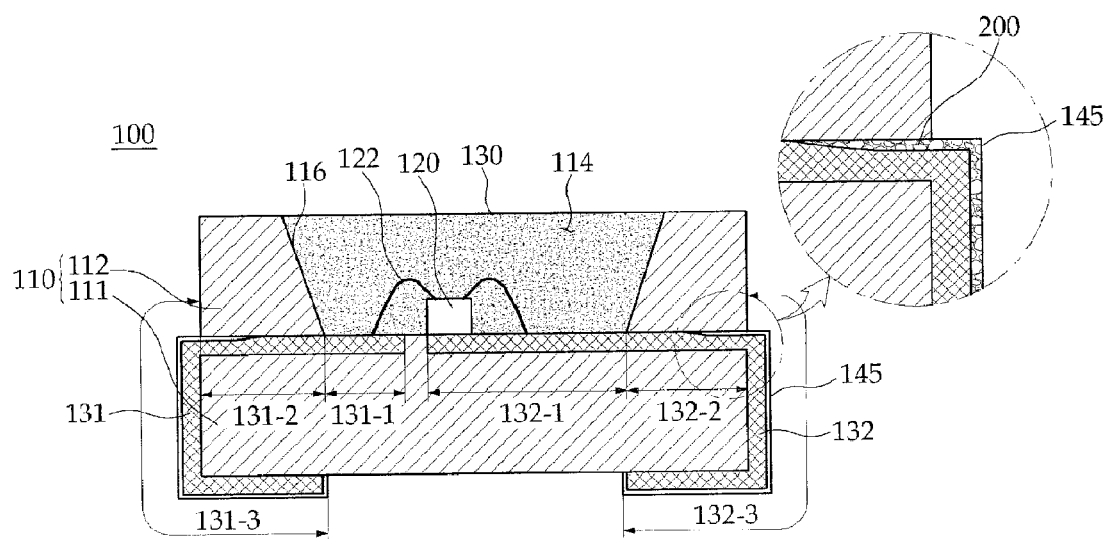
FIG. 1 is a cross sectional view for showing a structure of a light emitting device package according to a first embodiment of the present invention.

FIG. 1 is a cross sectional view for showing a structure of a light emitting device package according to a first embodiment of the present invention.

As shown in FIG. 1, the light emitting device package 100 according to the first embodiment comprises a housing 110 having a cavity 114, a first and a second lead frame 131, 132, a light emitting device 120 and an encapsulant 130.

The housing 110 may be made of PCB, a ceramic substrate or a resin, and the housing is formed of Polyphthalamide resin PPA in this embodiment. The housing 110 includes a lower housing 111 and an upper housing 112. The lower housing 111 and the upper housing 112 may be formed integrally with the first, second lead frame 131, 132 by injection molding, or the upper housing 112 may be joined on the lower housing 111 and the first and second lead frame 131, 132.

The housing 110 of the first embodiment comprises the lower housing 111 and the upper housing 112 which are formed integrally, and for convenience separate reference numbers are shown for the upper housing and the lower housing.

The first and the second lead frame 131, 132 penetrate the housing 110, and the frames are installed in the cavity of the housing and at the outside of the housing. The first embodiment shows the two lead frames 131,132 and however the number of the lead frames may be more than three according to a design of the light emitting device package.

Each of the first lead frame and the second lead frame 131, 132 comprises a first section 131-1, 132-1 positioned in the cavity 114, a second section 131-2, 132-2 extending from the first section 131-1, 132-2 and surrounded by the housing 110, and a third section 131-3, 132-3 extending from the second section 131-2, 132-2 and exposed at the outside of the housing 110. In addition, the first lead frame 131 and the second lead frame 132 are electrically connected to the light emitting device 120 in order to supply power to the light emitting device 120. As illustrated in FIG. 1, an area 200 (or gap) may be provided between the second section 131-2, 132-2 of the lead frame 131, 132 and at least one of the upper housing 112 and the lower housing 111. The second section 131-2, 132-2 of the lead frame 131, 132 may include a first region that directly contacts the housing 110 and a second region corresponding to the gap 200. Hence, the first region may have a different thickness from the second region in the second section 131-2, 132-2 of the lead frame 131, 132. The gap may have a smaller height than a thickness of the light emitting device 120. The gap 200 may have a length shorter than that of the second section 131-2, 132-2 of the lead frame 131, 132.

A shape of the cavity 114 which is shown in top view may be circle or polygon, and a surrounding surface 116 forming the cavity 114 of the housing may be vertical or inclined to a top surface of the lower housing 111.

The light emitting device 120 is positioned in the cavity 114 on/over the first lead frame 131 or the second lead frame 132. The light emitting device 120 is electrically connected to the first lead frame 131 and the second lead frame 132 through a wire 122.

Although not shown, the light emitting device 120 may be connected to the first lead frame 131 and the second lead frame 132 in various manners. For example, the device may be connected to the first lead frame 131 and the second lead frame 132 by using a flip bonding method without wire, or the device may be die-boned to the second lead frame 132 and connected to the first lead frame 131 through a wire.

Figure 2:
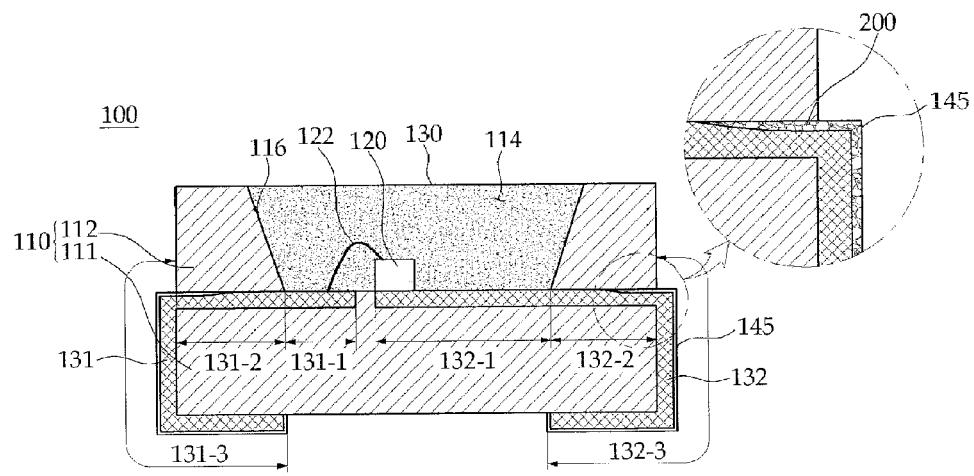
FIG. 2 is an another cross sectional view for showing a structure of a light emitting device package according to a first embodiment of the present invention.

As shown in FIG. 2, the light emitting device 120 is electrically connected to the first lead frame through a wire 122, and the light emitting device 120 itself may be connected to the second lead frame. In addition, although not shown, the light emitting device 120 may be directly connected to the first lead frame 131 and connected to the second lead frame 132 through a wire 122.

The light emitting device 120 may be positioned in the cavity or in the housing 110. In addition, the light emitting device 120 may be positioned on another lead frame, not the first lead frame 131 and the second lead frame 132.

The light emitting device 120 may be a light emitting diode chip for emitting red, green or blue light or a light emitting diode chip for emitting ultraviolet light.

An encapsulant 130 is filled in the cavity 114 of the housing. The encapsulant 130 may be made of transparent resin such as silicon resin or epoxy resin, and it may include a fluorescent material which is entirely or partly distributed in the transparent resin. The first lead frame 131 and the second lead frame 132 penetrate the housing, and are divided into at least two parts so that each of the lead frame 131, 132 may be exposed at the outside of the housing 110.

In addition, the first lead frame 131 and the second lead frame 132 may be respectively bended to an outside surface of the housing 110 by a trim process and a forming process. In the first embodiment, the first lead frame 131 and the second lead frame 132 are bended to contact a side surface and a bottom surface of the lower housing 111.

The first lead frame 131 and the second lead frame 132 may be made of a metal or an alloy having copper Cu as a main component, and the frames may have on its surface more than one plating layer such as a nickel plating layer, a gold plating layer, and a silver plating layer. In this embodiment, a silver plating layer (not shown) is formed on the first lead frame 131 and the second lead frame 132.

Meantime, each of the second section 131-2, 132-2 of the first lead frame 131 and the second lead frame 132 which is surrounded by the housing by penetrating the housing has a boundary surface with the housing. The second section of the respective lead frame does not contact entirely with the housing, and its certain part is distant from the housing. In other words, while the first lead frame 131 and the second lead frame 132 passes through a trim process and a forming process, and the frames 131, 132 do not contact tightly with the housing 110 and may be separated from the housing 110.

Main reason is a stress at a boundary surface where the first, second lead frame and the housing contact each other, and a side reason is that the first, second lead frame and the housing are made of different materials having different heat-inflation coefficient. In this case, an area may be created between the first, second lead frame and the housing 110. Accordingly, the first, second lead frame exposed in the area 200 is oxidized by moisture included in air. As time passes, this oxidization of the first, second lead frame progresses to an area adjacent to the light emitting device and an air gap (not shown) is created between the light emitting device 120 and the first, second lead frame. When the light emitting device 120 is operating, it generates heat back toward the light emitting device 120 and the air gap (not shown) blocks a passage for emitting heat through the first, second lead frame.

In the first embodiment, a metal layer 145 is positioned in an area or the gap 200 defined by a distance between the housing 110 and the respective first, second lead frame 131, 132. The metal layer 145 is filled in the area or the gap 200 to prevent air, moisture or foreign substances from entering the area or the gap 200. Accordingly, the metal layer 145 can prevent the first, second lead frame 131,132 exposed in the area or the gap 200 from being oxidized by moisture. In addition, the metal layer 145 prevents oxidization of the first and second lead frame 131,132, thereby obtaining unique electric characteristics of the first and second lead frame 131, 132. The metal layer 145 is extended from the second section 131-2, 132-2 of the first and the second lead frame 131,132 to the third section 131-3, 132-3 of the first and the second lead frame 131, 132 exposed at an outside of the housing 110. The metal layer 145 prevents oxidization, which is caused by exposure to outside air, of the third section 131-3, 132-3 of the first and second lead frame 131,132. In addition, deterioration of the electric characteristics due to the oxidization can be prevented. The metal layer 145, which is extended from the area or the gap 200 onto the third section 131-3, 132-3 of the first, second lead frame 131, 132, may be formed through a plating process. As illustrated in FIGS. 1 and 2, the area or gap 200 may be provided between the second section 131-2, 132-2 of the lead frame 131, 132 and at least one of the upper housing 112 and the lower housing 111. The second section 131-2, 132-2 of the lead frame 131, 132 may include a first region that directly contacts the housing 110 and a second region corresponding to the gap 200. Hence, the first region may have a different thickness from the second region in the second section 131-2, 132-2 of the lead frame 131, 132. The gap 200 may have a height smaller than a thickness of the light emitting device 120. The gap may have a length shorter than that of the second section 131-2, 132-2 of the lead frame 131, 132. However, a method of forming the metal layer is not limited to the plating process. Any process is possible as long as it is capable of forming the metal layer in the area 200 and on the lead frame 131, 132. A material of the metal layer 145 may include Tin. Tin is excellent and more economic compared with other metals excluding gold, in terms of heat transfer characteristics. In addition, when installing the light emitting device package 100 on a substrate with lead by the surface mount technology; tin has an excellent electric bonding capacity and conductance with the lead. Accordingly, the metal layer improves radiation heat characteristics when heat in operation of the light emitting device is radiated to the substrate along the first or second lead frame 131, 132.

Figure 3:
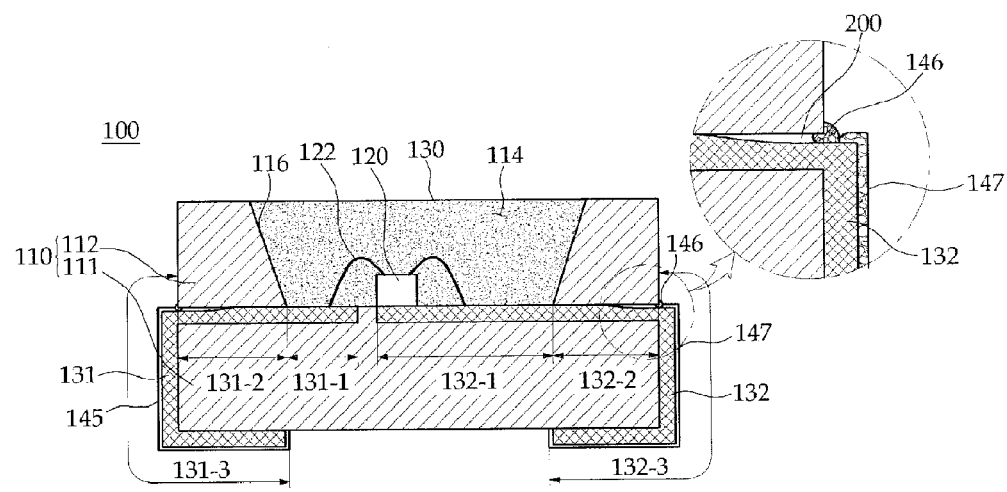
FIG. 3 is a cross sectional view for showing a light emitting device package according to a second embodiment of the present invention.

FIG. 3 is a cross sectional view of showing the light emitting device package according to the second embodiment.

The description repeated in the first embodiment will be omitted in the description of the second embodiment.

In FIG. 3, a sealant 146 of the second embodiment seals the area 200 between the housing 100 and the respective first and second lead frame 131,132. The sealant 146 seals the area to prevent air, moisture, foreign substances from entering. Accordingly, it prevents the first and second lead frame 131, 132 exposed to the area 200 from being oxidized by moisture.

For the sealant 146, it is preferred to use a material which can adhere well to the housing and the first and second lead frame 131,132. For example, it is preferred to use a material having the same or similar heat expansion coefficient as/to that of the housing or the first and second lead frame 131,132. In other words, it is preferred to use same resin as the housing 110 or same metal as the first and second lead frame 131, 132.

In case the sealant 146 is metal, it prevents deterioration of unique electric characteristic of the first and second lead frame 131,132 caused as time passes.

A sealing method may be spray painting process, injection molding process and so on. It is not limited to the process like this.

A metal film 147 may be formed on a surface of the third section 131-3, 132-3 of the first and the second lead frame 131, 132 exposed to an outside of the housing 100. The metal film 147, which is formed on the third section 131-3, 132-3 of the first and second lead frame 131, 132, may be made by a plating process. The metal film 147 includes Tin. As illustrated in FIGS. 1-3, the area or gap 200 may be provided between the second section 131-2, 132-2 of the lead frame 131, 132 and at least one of the upper housing 112 and the lower housing 111. The second section 131-2, 132-2 of the lead frame 131 132 may include a first region that directly contacts the housing 110 and a second region corresponding to the gap 200. Hence, the first region may have a different thickness from the second region in the second section 131-2, 132-2 of the lead frame 131, 132. The gap 200 may have a height smaller than a thickness of the light emitting device 120. The gap 200 may have a length shorter than that of the second section 131-2, 132-2 of the lead frame 131, 132.

FIGS. 4-7 are views of showing a manufacture process of the light emitting device package according to the first embodiment.

Figure 4:
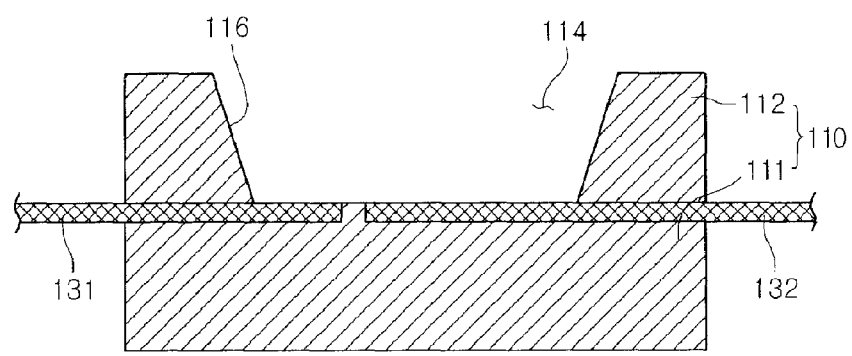
FIGS. 4-7 are views of showing a manufacture process of the light emitting device package according to the first embodiment.

As shown in FIG. 4, the first lead frame 131 and the second lead frame 132 are positioned in an injection apparatus, and the first lead frame 131 and the second lead frame 132 and the housing are made integrally by injecting resin to the apparatus. The first lead frame 131 and the second lead frame 132 are made of metal or alloy having copper as a main component, and surfaces of which may have more than one plating layer such as a nickel plating layer, a gold plating layer or silver plating layer. In this embodiment, the surfaces of the first lead frame 131 and the second lead frame 132 have a silver plating layer (not shown).

Figure 5:
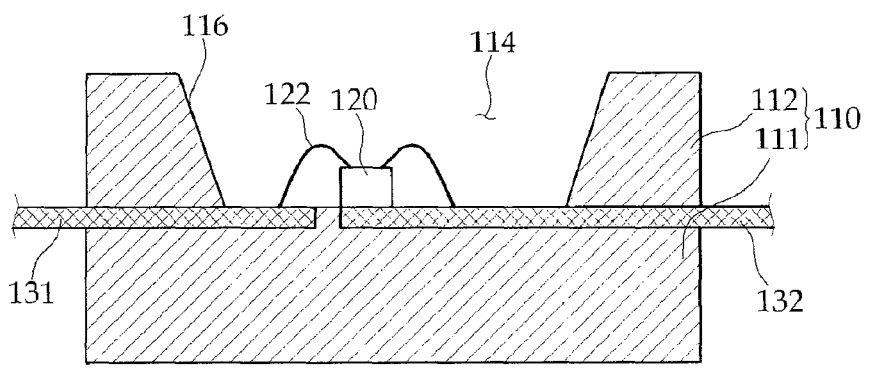

In FIG. 5, the light emitting device 120 is installed on the second lead frame 132, and the light emitting device 120 is electrically connected to the first lead frame 131 and the second lead frame 132 through a wire 122.

Figure 6:
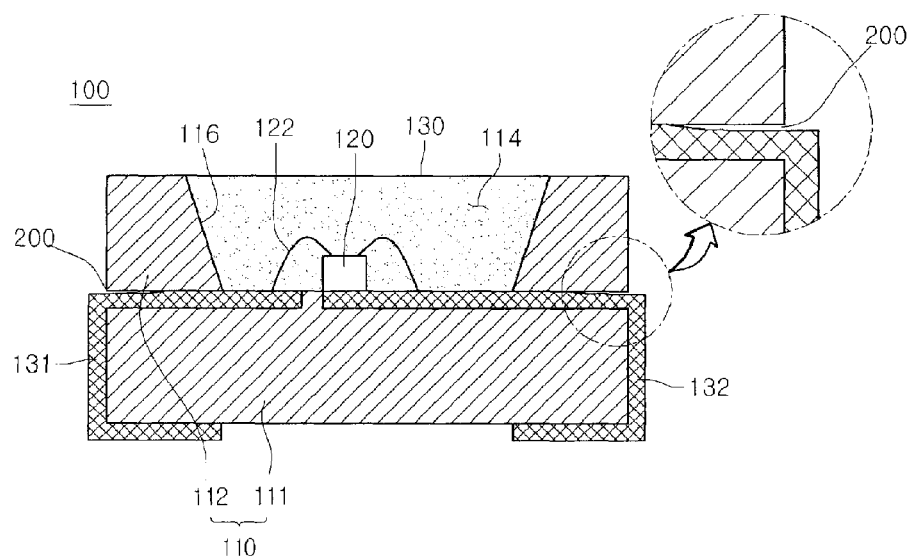

In FIG. 6, an encapsulant 130 is injected to the cavity 114 of the housing 110. The encapsulant 130 may include fluorescent material. By trimming and forming the first lead frame 131 and the second lead frame 132, the lead frames are made to contact sides and bottom surfaces of the housing 110. During the trimming and forming process for the lead frames, an area 200 may be created between the lead frame 131, 132 and the housing 110.

Figure 7:
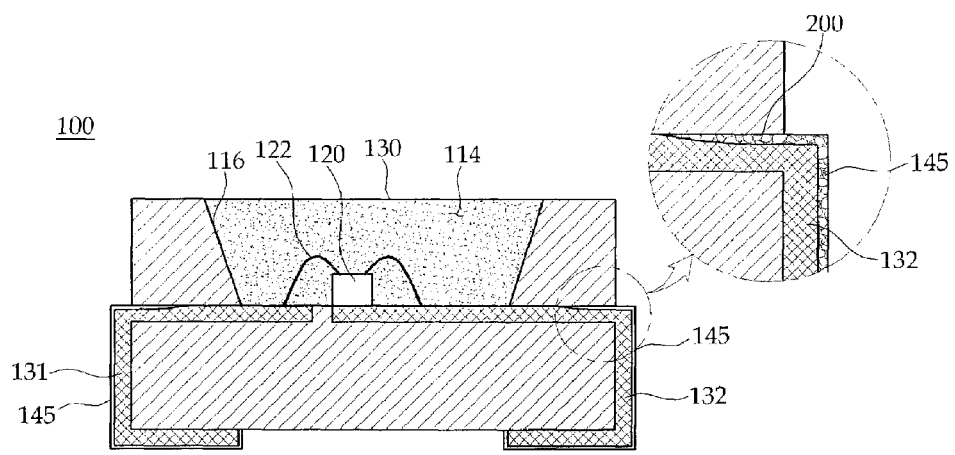

As shown in FIG. 7, a metal layer 145 is filled in the area 200, and the metal layer is formed on the first lead frame 131 and the second lead frame 132 which are exposed at the outside of the housing. The metal layer 145 may be formed through a plating process, and for example Tin may be used for the metal layer.

Figure 8:
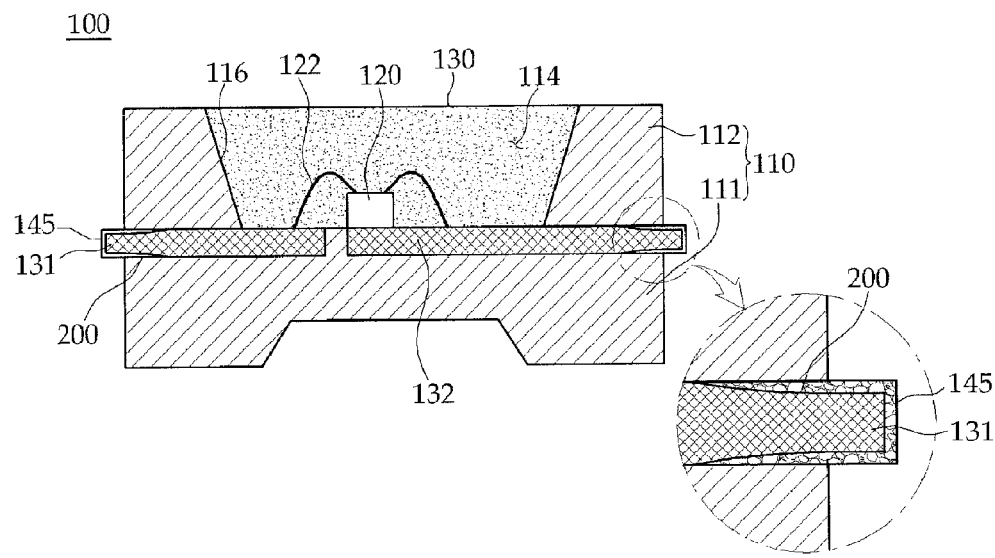
FIG. 8 is a view for showing a light emitting device package according to a third embodiment of the present invention.

FIG. 8 is a view of showing a light emitting device package according to a third embodiment. The description repeated in the first embodiment is omitted in a description of the third embodiment.

As shown in FIG. 8, the light emitting device package according to a third embodiment comprises a housing 110 having a cavity 114, a first, second lead frame 131,132, a light emitting device 120 and an encapsulant 130.

A part of the first, second lead frame 131,132 are projected toward an outside of the housing 110, and unlike the first embodiment the lead frames are not contacted with the sides and the bottom of the housing 110. However, during a trimming process for the first, second lead frame 131,132, an area 200 may be created between the lead frames 131, 132 and the housing 110, and a metal layer 145 is formed to fill the area 200.

FIGS. 9-12 are views of showing a manufacture process of the light emitting device package according to the second embodiment.

Figure 9:
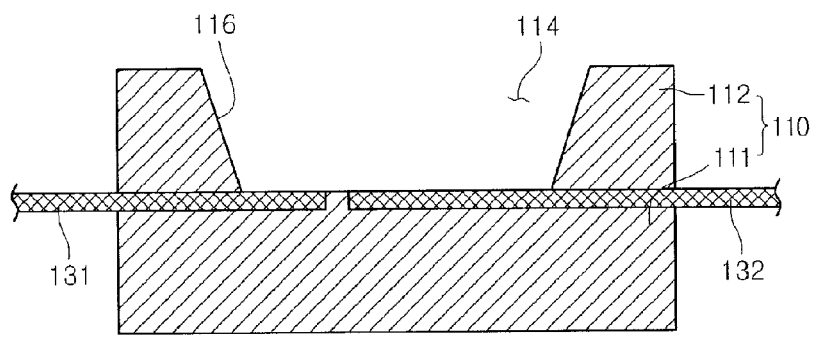
FIGS. 9-12 are views of showing a manufacture process of the light emitting device package according to the second embodiment.

As shown in FIG. 9, the first lead frame 131 and the second lead frame 132 are positioned in an injection apparatus, and the first lead frame 131 and the second lead frame 132 and the housing are made integrally by injecting resin to the apparatus. The first lead frame 131 and the second lead frame 132 are made of metal or alloy having copper as a main component, and surfaces of which may have more than one plating layer such as a nickel plating layer, a gold plating layer or silver plating layer. In this embodiment, the surfaces of the first lead frame 131 and the second lead frame 132 have a silver plating layer (not shown).

Figure 10:
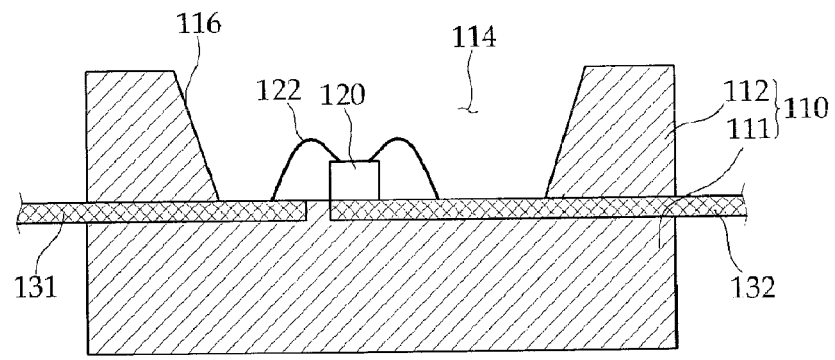

In FIG. 10, the light emitting device 120 is installed on the second lead frame 132, and the light emitting device 120 is electrically connected to the first lead frame 131 and the second lead frame 132 through a wire 122.

Figure 11:
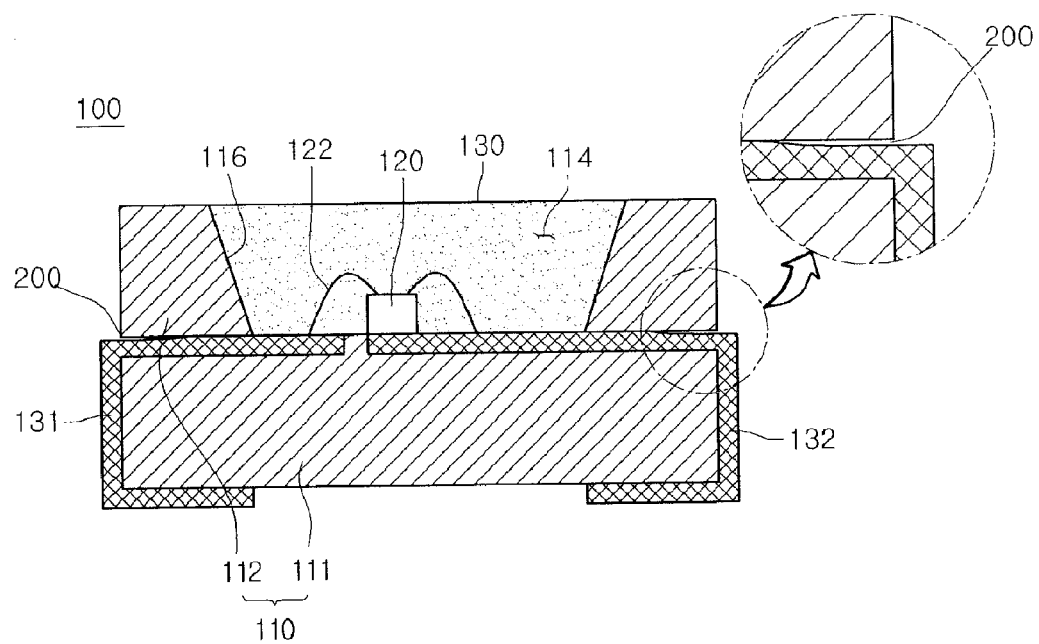

As shown in FIG. 11, an encapsulant 130 is injected to the cavity 114 of the package body 110. By trimming and forming the first lead frame 131 and the second lead frame 132, the lead frames are made to contact sides and bottom surfaces of the housing 110. During the trimming and forming process for the lead frames, an area 200 may be created between the lead frame 131, 132 and the housing 110.

Figure 12:
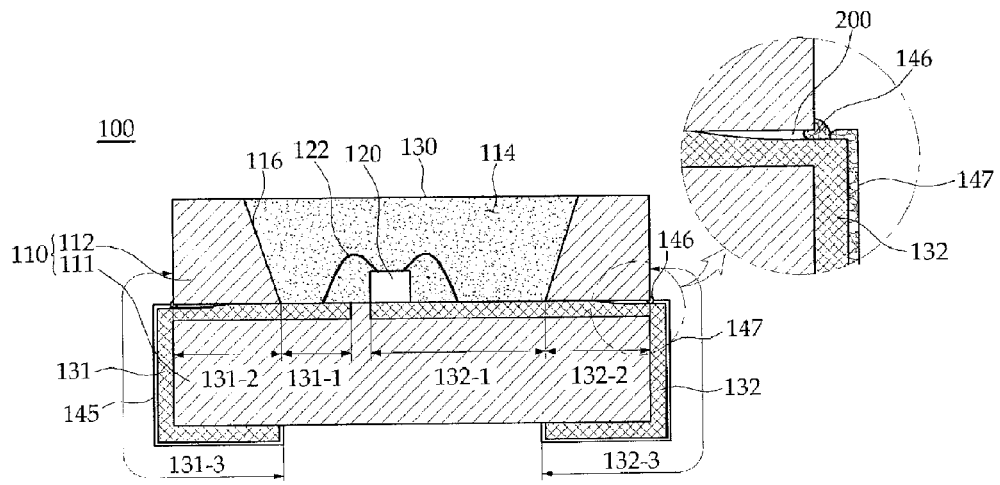

As shown in FIG. 12, the area 200 is sealed by a sealant 146 and a material of the sealant may be a metal or resin. A metal layer 147 is formed on the first lead frame 131 and the second lead frame 132 which are exposed at the outside of the housing. The metal layer 147 may be formed through a plating process, and for example Tin may be used for the metal layer.

Figure 13:
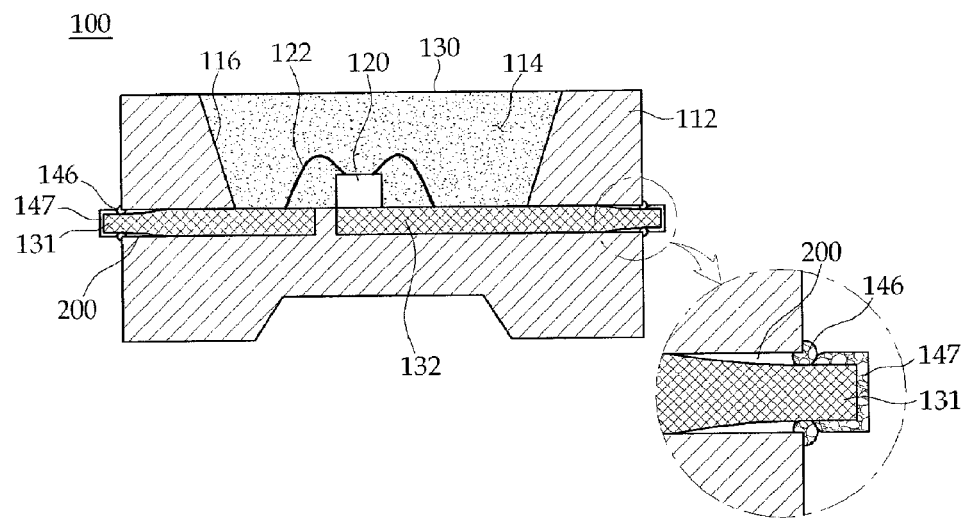
FIG. 13 is a view for showing a light emitting device package according to a fourth embodiment of the present invention.

FIG. 13 is a view of showing a light emitting device package according to a fourth embodiment. The description repeated in the second embodiment is omitted in a description of the fourth embodiment.

As shown in FIG. 13, the light emitting device package according to a fourth embodiment comprises a housing 110 having a cavity 114, a first, second lead frame 131,132, a light emitting device 120 and an encapsulant 130.

A part of the first, second lead frame 131, 132 is projected toward an outside of the housing 110, and unlike the first embodiment the lead frames are not contacted with the sides and the bottom of the housing 110. However, during a trimming process for the first, second lead frame 131,132, an area 200 may be created between the lead frames 131, 132 and the housing 110, and the area 200 is sealed by the sealant 146.

Although in the above embodiments the plural lead frames are made by a trimming and forming process, a shape of one of the lead frames may be a bar for penetrating the package body in the up and down direction, and the other lead frame may be formed by the trimming and forming process. In addition, the lead frames may have a metal film thereon.

What is claimed is:

1. A light emitting device package comprising:
   a housing including a cavity and an upper section over a lower section;
   a light emitting device positioned in the cavity;
   a lead frame including a first section which is electrically connected to the light emitting device and overlaps the cavity, a second section which is extended from the first section and disposed between the upper section and the lower section, and a third section which is extended from the second section and at least partially overlaps an external surface of the lower section; and
   a gap provided between the second section of the lead frame and at least one of the upper section and the lower section of the housing;
   wherein the gap is extended in a direction toward the cavity from an outer edge region between the upper section and the lower section of the housing,
   wherein the gap has a length shorter than that of the second section of the lead frame,
   wherein the second section of the lead frame includes a first region directly contacted with the housing and a second region corresponding to the gap,
   wherein the gap has a smaller height than a thickness of the light emitting device.

2. The light emitting device package as set forth in claim 1, wherein the gap includes a first gap between the second section of the lead frame and the upper section of the housing and a second gap between the second section of the lead frame and the lower section of the housing.

3. The light emitting device package as set forth in claim 1, wherein the first gap is vertically overlapped with the second gap in the housing.

4. The light emitting device package as set forth in claim 1, further comprising a metal layer disposed in the gap.

5. The light emitting device package as set forth in claim 4, wherein the metal layer is directly contacted with a portion of the second section of the lead frame.

6. The light emitting device package as set forth in claim 5, wherein the metal layer includes a first metal layer disposed between the second section of the lead frame and the upper section of the housing.

7. The light emitting device package as set forth in claim 6, wherein the metal layer includes a second metal layer disposed between the second section of the lead frame and the lower section of the housing.

8. The light emitting device package as set forth in claim 5, wherein the metal layer is extended to a surface of the third section of the lead frame.

9. The light emitting device package as set forth in claim 4, wherein a material of the metal layer includes Tin.

10. The light emitting device package as set forth in claim 1, further comprising a sealant member disposed in the gap.

11. The light emitting device package as set forth in claim 10, wherein the sealant member is formed of a resin material.

12. The light emitting device package as set forth in claim 10, wherein the sealant member is formed of a metal material.

13. A light emitting device package comprising:
    a housing including a cavity and an upper section over a lower section;
    a light emitting device positioned in the cavity;
    a first lead frame disposed on a bottom surface of the cavity;
    a second lead frame disposed on the bottom surface of the cavity and spaced apart from the first lead frame;
    a gap provided between at least one of the first and second lead frames and the upper section of the housing,
    wherein each of the first and second lead frames includes a first section which is electrically connected to the light emitting device and overlaps the cavity, a second section which is extended from the first section and disposed between the upper section and the lower section, and a third section which is extended from the second section and at least partially overlaps an external surface of the lower section,
    wherein the gap is disposed between the second section and at least one of the upper section and the lower section of the housing,
    wherein the gap is extended in a direction toward the cavity from an outer edge region between the upper section and the lower section of the housing,
    wherein the gap has a length shorter than that of the second section,
    wherein the second section includes a first region directly contacted with the housing and a second region corresponding to the gap,
    wherein the first region has a different thickness from the second region in the second section.

14. The light emitting device package as set forth in claim 13, further comprising a sealant member between the housing and the second section of the lead frame.

15. The light emitting device package as set forth in claim 13, wherein the gap includes a first gap between the first lead frame and the upper section of the housing and a second gap between the second lead frame and the upper section of the housing.

16. The light emitting device package as set forth in claim 15, further comprising a first sealant member disposed in the first gap and a second sealant member disposed in the second gap.

17. The light emitting device package as set forth in claim 16, wherein the first sealant member is formed of the same material as the second sealant member.

18. The light emitting device package as set forth in claim 17, wherein the first and second sealant members are formed of a resin material or a metal material.

19. The light emitting device package as set forth in claim 13, wherein a surface of the third section of each of the first and second lead frames includes a metal layer including at least one of nickel, gold, or silver,
    wherein the metal layer is not contacted with a surface of the first section of each of the first and second lead frames.

20. The light emitting device package as set forth in claim 13, wherein a lower surfaces of the first and second sections of each of the first and lead frames form a substantially planar surface.

* * * * *